(12) United States Patent
Wallace et al.

(10) Patent No.: US 6,784,507 B2
(45) Date of Patent: Aug. 31, 2004

(54) GATE STRUCTURE AND METHOD

(75) Inventors: Robert M. Wallace, Richardson, TX (US); Bruce E. Gnade, Lewisville, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/259,677

(22) Filed: Sep. 27, 2002

(65) Prior Publication Data

US 2003/0062586 A1 Apr. 3, 2003

Related U.S. Application Data

(60) Provisional application No. 60/325,519, filed on Sep. 28, 2001.

(51) Int. Cl.$^7$ ............................................. H01L 29/76
(52) U.S. Cl. ..................... 257/410; 257/411; 257/616
(58) Field of Search ................................ 257/410, 411, 257/616, 369, 370, 198; 438/287, 591

(56) References Cited

U.S. PATENT DOCUMENTS 6,437,392 B1 * 8/2002 Schneemeyer et al. ...... 257/310
6,544,875 B1 * 4/2003 Wilk .......................... 438/591

* cited by examiner

*Primary Examiner*—Mark V. Prenty
(74) *Attorney, Agent, or Firm*—Carlton H. Hoel; W. James Brady; Frederick J. Telecky, Jr.

(57) ABSTRACT

CMOS and BiCMOS structures with a silicate-germanate gate dielectric on SiGe PMOS areas and Si NMOS areas plus HBTs with Si—SiGe emitter-base junctions.

5 Claims, 7 Drawing Sheets

GATE STRUCTURE AND METHOD

RELATED APPLICATIONS

This application claims priority from provisional patent application Ser. No. 60/325,519, filed Sep. 28, 2001. The following patent applications disclose related subject matter: Ser. Nos. 09/436,895, filed Nov. 9, 1999, now U.S. Pat. No. 6,291,283; Ser. No. 09/478,845, flied Jan. 7, 2000, now U.S. Pat. No. 6,544,875; Ser. No. 09/851,318, filed May 9, 2001; and Ser. No. 10/409,007, filed Apr. 8, 2003. These applications have a common assignee with the present application.

BACKGROUND OF THE INVENTION

The invention relates to electronic semiconductor devices, and, more particularly, to integrated circuit dielectric structures and fabrication methods.

The trend in semiconductor integrated circuits to higher device densities by down-scaling structure sizes and operating voltages has led to silicon field effect (MOS) transistor gate dielectrics, typically made of silicon dioxide, to approach thicknesses on the order of 1–2 nm to maintain the capacitive coupling of the gate to the channel. However, such thin oxides present leakage current problems due to carrier tunneling through the oxide. Consequently, alternative gate dielectrics with greater dielectric constants to permit greater physical thicknesses have been proposed. Indeed, $Ta_2O_5$, $(Ba,Sr)TiO_3$, and other high dielectric constant materials have been suggested, but such materials have poor interface stability with silicon.

Wilk and Wallace, Electrical Properties of Hafnium Silicate Gate Dielectrics Deposited Directly on Silicon, 74 Appl. Phys. Lett. 2854 (1999), disclose measurements on capacitors with a hafnium silicate dielectric formed by sputtering deposition (at a pressure of $5 \times 10^{-6}$ mTorr and substrate temperature of 500 C) of a 5 nm thick $Hf_6Si_{29}O_{65}$ ($Hf_{0.37}Si_{1.78}O_4$) layer directly onto silicon together with a gold top electrode on the silicate dielectric. Such capacitors showed low leakage current, thermal stability, an effective dielectric constant of about 11, and a breakdown field of 10 MV/cm.

Another approach to enhanced performance for silicon integrated circuits uses $Si_xGe_{1-x}$ layers on silicon substrates to achieve higher hole mobilities for PMOS plus provide heterojunction bipolar transistors (HBTs). Sharma et al, Properties of Gate Quality Silicon Dioxide Films Deposited on Si—Ge Using Remote Plasma-Enhanced Chemical Vapor Deposition, 17 JVST B 460 (2000) describe measurements on capacitors with silicon dioxide dielectric on $Si_xGe_{1-x}$ layers of thickness 20–40 nm and with x in the range of 0.85–0.9. Similarly, Ngai et al, Electrical Properties of $ZrO_2$ Gate Dielectric on SiGe, 76 Appl.Phy.Lett. 502 (2000) reveals measurements of capacitors with 3–8 nm thick $ZrO_2$ dielectric on 40 nm thick layers of $Si_{0.85}Ge_{0.15}$ on silicon.

However, such dielectrics have problems with interfacial layers formed at the dielectric-SiGe interface.

Alternative SiGe approaches deposit a thin buffer Si layer on the SiGe in order to form $SiO_2$ gate dielectric, but such approaches fail to achieve the full advantage of the increased mobility of SiGe.

SUMMARY OF THE INVENTION

The present invention provides integrated circuit fabrication with metal silicate or silicate-germanate dielectrics for SiGe and Si surfaces without buffer layers.

This has advantages including improved performance CMOS integrated circuits with simple processing.

BRIEF DESCRIPTION OF THE DRAWINGS

The drawings are heuristic for clarity.

DESCRIPTION OF THE PREFERRED EMBODIMENTS

1. Overview

Preferred embodiment integrated circuits and structures include SiGe surfaces with gate dielectrics made of metal silicate-germanates including the special cases of metal silicates or metal germanates. Examples include hafnium silicate-germanates, zirconium silicate-germanates, lanthanum silicate-germanates, and so forth. Such silicate-germanates are thermodynamically stable on SiGe.

Further preferred embodiments have such silicate-germanates on Ge or Si substrates and also include use of silicate-germanates as at least a portion of an isolation dielectric.

Each of these preferred embodiment structures could be used in combination with disparate structures in CMOS or BiCMOS integrated circuits; for example, CMOS with a SiGe surface for PMOS and a Si surface for NMOS and a common hafnium silicate-germanate dielectric for both PMOS and NMOS.

Alternative preferred embodiments incorporate Si and/or Ge into metal aluminates as the gate dielectric for enhanced thermodynamic stability.

2. Silicate Gate Dielectric on SiGe Plus Si CMOS Preferred Embodiments

FIGS. 1a–1e illustrate in cross sectional elevation views the steps of first preferred embodiment fabrication methods for integrated circuits including field effect transistors (e.g., CMOS or BiCMOS) with hafnium silicate gate dielectrics, polysilicon gates, and SiGe channel region PMOS together with Si channel region NMOS. The preferred embodiments include the following steps:

(1) Substrate.

Figure 1A:
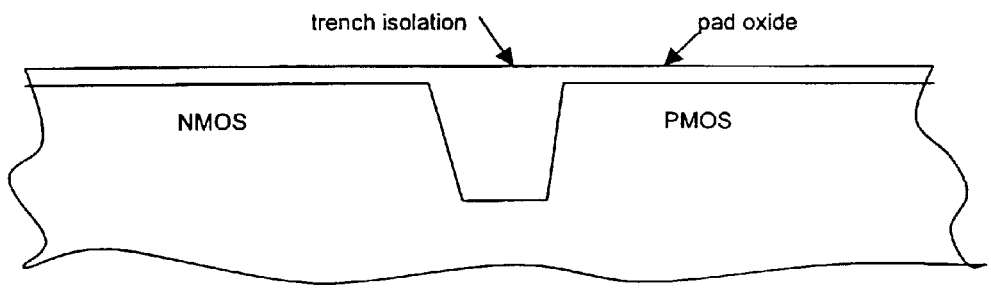
FIGS. 1a–1e are cross sectional elevation views of steps in a first preferred embodiment fabrication method.

Start with a p-type silicon (or silicon-on-insulator) wafer with <100> orientation and form shallow trench isolation by pad oxide growth, nitride deposition, trench pattern, nitride-oxide-silicon trench etch (trench depth may be 300 nm), trench surface oxidation, trench fill by blanket APCVD oxide deposition, etchback or CMP planarization, and nitride strip leaving pad oxide. FIG. 1a is a cross-sectional elevation view of the substrate illustrating the trench isolation and locations for fabrication of NMOS and PMOS transistors.

Next, strip the pad oxide from the PMOS areas, and use the remaining pad oxide (and trench isolation) as a mask oxide for selective epitaxial growth of $Si_{0.85}Ge_{0.15}$ to a thickness of 30 nm on the silicon surface in the PMOS areas. This layer will be compressively strained but stable due to its thinness; see FIG. 1b.

Then perform multiple masked dopant implants to form n- and p-type wells (plus, optionally, memory cell array wells and bipolar device buried layers) plus form channel stop regions, punchthrough deterrence regions, and threshold adjust regions. Note that the implant doses and depths may differ for memory cell array transistors as compared to peripheral transistors. Also, both high and low voltage transistors of the same type may be formed and may have different implant doses and depths. A rapid thermal anneal (e.g., 1050 C for 30 s) activates and diffuses the implanted dopants (e.g., boron and phosphorus).

(2) Gate Dielectric Deposition.

Strip the residual pad oxide from the NMOS areas with a buffered HF solution and rinse and dry; this exposes the Si and SiGe in the locations for NMOS and PMOS transistors, respectively. Heterojunction bipolar transistors (HBTs) will be in SiGe areas with the SiGe as the base and deposited polysilicon emitters.

Figure 1B:
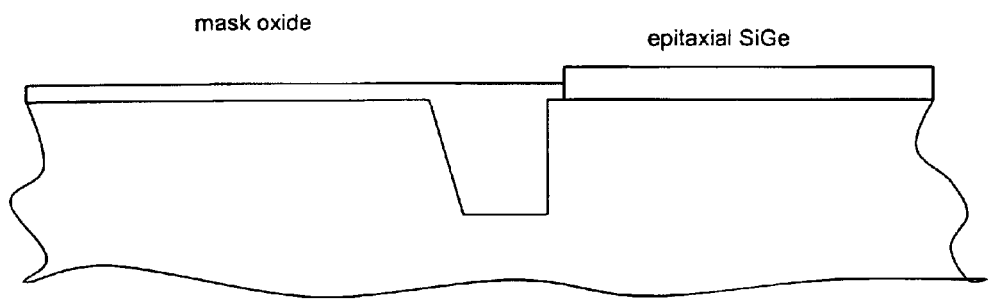
Figure 1C:
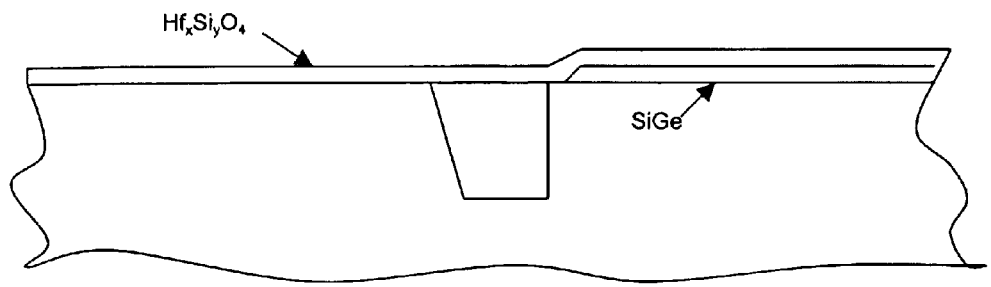
Figure 1D:
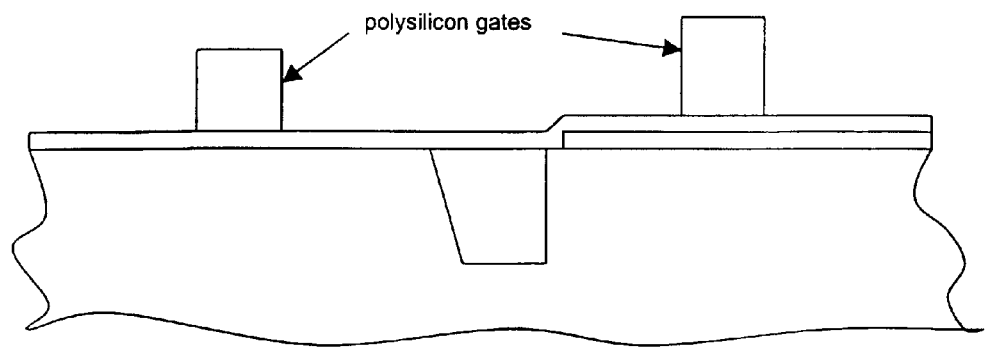
Figure 1E:
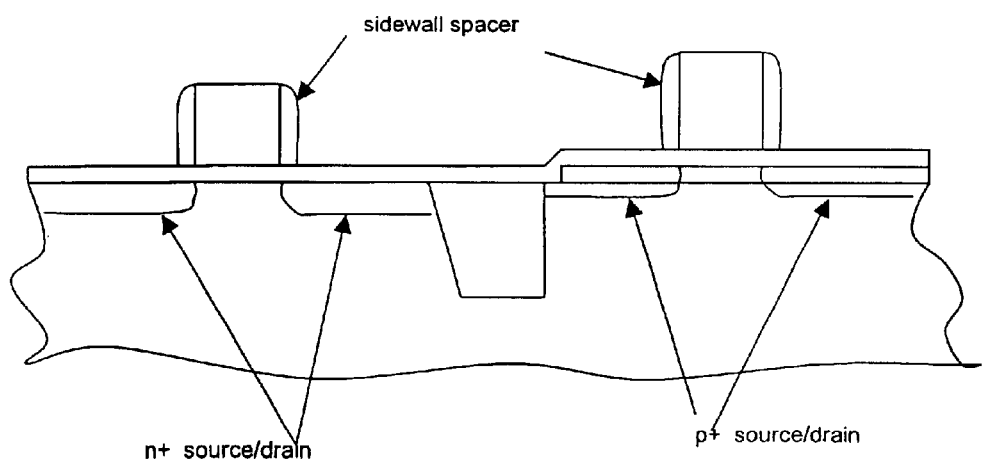

Next, deposit a 7 nm-thick gate dielectric layer of $Hf_xSi_yO_4$, such as by sputtering or LPCVD; see FIG. 1c. Sputtering can use targets of $HfO_2$ and $SiO_2$ to form the silicate dielectric layer with the ratio of Hf to Si and oxygen content easily controlled by source target composition and deposition conditions. The composition of the dielectric is controlled to yield interfaces with the SiGe and Si which will have high carrier mobilities in the channels for the CMOS devices. In particular, avoid excess oxygen to prevent oxidation at the SiGe interface. A Hf-poor dielectric deters crystallization, so the dielectric will be amorphous and less leaky. Indeed, the closer the composition is to a phase such as $HfO_2$ or $HfSiO_4$ ($HfO_2+SiO_2$), the more likely the dielectric is to crystallize and show leakage along grain boundaries. The preferred embodiments seek to get a point in the phase space which avoids such crystallization, such as $SiO_2$ rich. But there is a tradeoff between preserving amorphicity and obtaining a high enough dielectric constant which crystallization enhances. In fact, the dielectric constant for $HfO_2$ is about 25 and that of $SiO_2$ is about 4, so a linear interpolation approximation for the dielectric constant of $Hf_xSi_{2-x}O_4$ is 4+11x. However, measured dielectric constants appear larger than the linear approximation, perhaps due to bonding changes as the metal concentration increases. Thus to have a dielectric constant of at least 10, the Hf content likely will need to be at least roughly 25% of the cations (i.e., x>0.5); but to avoid easy crystallization, the Hf content may need to be much less than 50% of the cations (i.e., x<<1). Various composition ranges will be suitable for differing applications, such as 0.6<x<0.7 may be a good tradeoff, 0.3<x<0.6 may have smaller leakage but low dielectric constant, whereas 0.7<x<0.8 may have higher dielectric constant but worse leakage. Further, oxygen deficiency in $Hf_xSi_{2-x}O_4$ can be countered by oxygen anneals.

With an effective dielectric constant of about 14, a 7 nm thick silicate gate dielectric has an equivalent silicon dioxide thickness of 2 nm but not the leakage (tunneling) current of such a thin silicon dioxide gate dielectric.

LPCVD formation of the silicate dielectric may have $SiH_4$ as the precursor for Si, $N_2O$ for oxygen, and $Hf(CH_3)_4$ for Hf at a total pressure in the range from 10 Pa (75 mTorr) to 3000 Pa (22.5 Torr) and with a substrate temperature in the range from 300 to 700 C. The ratio of oxygen source to hafnium and silicon sources should insure essentially complete oxidation and minimal Hf—Si bonding. The ratio of hafnium source to silicon source determines the ratio of Hf to Si in the resultant dielectric.

The precursors essentially react on the surface, and the overall reaction could approximate:

$SiH_4+Hf(CH_3)_4+20\ N_2O \rightarrow HfSiO_4+4\ CO_2+8\ H_2O+20\ N_2$.

With an overly oxidizing deposition the Si in the SiGe surface may preferentially oxidize and leave Ge at a rough interface.

Other Hf precursors such as bis-2,4 pentadione hafnium, TDMAH (tetrakis-dimethylamino hafnium) or $HfCl_4$ could be used instead of $Hf(CH_3)_4$. Indeed, a single precursor incorporating both Hf and Si, such as a Hf siloxane, could be used.

Alternative preferred embodiment silicate dielectrics include $Zr_xSi_yO_4$ and $La_xSi_yO_4$ and other metal silicates $M_xSi_yO_4$ where the M—O bonding is stronger than Si—O bonding to insure stability on Si and SiGe surfaces. Again, the silicate dielectric composition should avoid stoichiometric silicate in order to deter crystallization and thus the metal fraction x should lie in ranges as previously described.

(3) Gate Material Deposition.

Deposit a layer of amorphous silicon (polysilicon) gate material of thickness 300 nm on the silicate gate dielectric. Low temperature LPCVD with silane keeps the thermal budget low and avoids crystallization of the silicate dielectric. A resistivity-reducing metal or silicide cap layer may also be deposited on the silicon layer.

(4) Gate Patterning.

Spin on, expose, and develop photoresist to define gates and gate level interconnects. Then with the photoresist as an etch mask, anisotropically plasma etch the amorphous silicon (polysilicon) to form gates and gate level interconnects. The etch may be a HBr plus oxygen plasma which is very selective to oxide and nitride and silicate dielectric. The gates may have lengths (line widths) on the order of 100–150 nm.

(5) Lightly-doped Drains.

Perform lightly doped drain (LDD) implants through the silicate dielectric and aligned to the gates with noncritical photoresist masking successively for NMOS and PMOS areas. Optionally, prior to the implant, grow a thin protective oxide on the sidewalls of the amorphous silicon gates with a low-temperature oxygen plasma. Further, optionally thin (or strip) the exposed silicate dielectric prior to implant to limit knock-on of Hf into the Si or SiGe substrate. A plasma etch with $CF_x+Cl_2$ at a substrate temperature of 200 C should gasify the silicate dielectric primarily as $HfCl_4$ $+SiF_4+CO_2$ plus related compounds. Alternatively, a wet etch could be used.

(6) Sidewall Spacers.

Form sidewall spacers on the gates (and gate level interconnects) by conformal deposition of a silicon nitride (or other convenient dielectric) layer followed by anisotropic etching. The anisotropic etch may be a plasma of fluorine plus an inert gas and which is selective to oxide.

(7) Source/Drains.

Perform source/drain implants through the (thinned or stripped) silicate dielectric and aligned to the gates plus sidewall spacers with successive noncritical masking for NMOS and PMOS areas. A subsequent variation after stripping exposed silicate dielectric would be a self-aligned silicidation to create a silicide on both the gate top and the source/drains. This silicidation may be by blanket metal (Ti or Co or Ni) deposition followed by reaction with underlying silicon, and then removal of unreacted metal (or TiN for the case of Ti silicidation in an nitrogen atmosphere).

(8) PMD and Interconnect Levels.

Form a planarized premetal dielectric (PMD) layer over the gates and gate level interconnects (such as reflowed BPSG or a stack of conformal and planarized layers which includes mobile getterers); the planarization may be by CMP or etch back. Then photolithographically define and etch vias through the PMD layer plus underlying silicate dielectric (if any) for contact to the source/drains and the gate/interconnects. Then fill the vias with conductive plugs by blanket deposition of conductive material (e.g., TiN, W, polysilicon, barrier layer plus fill, etc.) followed by etchback or CMP to remove the material except for the plugs filling the vias.

Then form overlying interconnect layers, and complete the integrated circuit with passivation and packaging.

Alternatives include using dual damascene for interconnection and via fabrication.

3. Silicate-germanate Gate Dielectric on SiGe and Si Preferred Embodiments.

Second preferred embodiments follow the steps of the first preferred embodiments but substitute a silicate-germanate gate dielectric for the silicate gate dielectric. In particular, in step (2) deposit $Hf_xGe_wSi_zO_4$ by sputtering or by LPCVD again to a thickness of about 7 nm. The sputtering target may be a mixture of $HfO_2$, $GeO_2$, and $SiO_2$, or may be a silicide such as $HfSi_2$ plus a SiGe alloy which would be reactively sputtered in an oxygen-argon (e.g., 50%–50%) plasma. Indeed, sputtering with silicide allows for an initial argon plasma to deposit a silicide at the interface followed by addition of oxygen to the plasma and formation of silicate. LPCVD precursors may be $GeH_4$, $SiH_4$, $N_2O$, and $Hf(CH_3)_4$ or other analogs of the precursors of the first preferred embodiments. The ratios of Hf to Ge to Si in the sources and the deposition conditions determine the resultant dielectric composition. The deposition onto the SiGe with a silicate-germanate having roughly the same silicon to germanium ratio as the SiGe deters exchange reactions of Si or Ge between the dielectric and the substrate. Again, the preferred embodiments seek a tradeoff between high dielectric constant and amorphous leakage control. A Hf-poor silicate-germanate deters crystallization so the dielectric will be amorphous. Indeed, analogous to the $Hf_xSi_yO_4$ of the first preferred embodiments, $Hf_xGe_wSi_zO_4$ with x in the range 0.4 to 0.8 yields a high enough dielectric constant plus high enough barrier to crystallization. And the ratio of w to z of roughly 15 to 85 matches the ratio of Ge to Si in the SiGe PMOS regions. Thus the second preferred embodiments provide gate dielectrics such as $Hf_{0.6}Ge_{0.2}Si_{1.2}O_4$ for CMOS with $Si_{0.85}Ge_{0.15}$ regions for PMOS and Si regions for NMOS.

Figure 2:
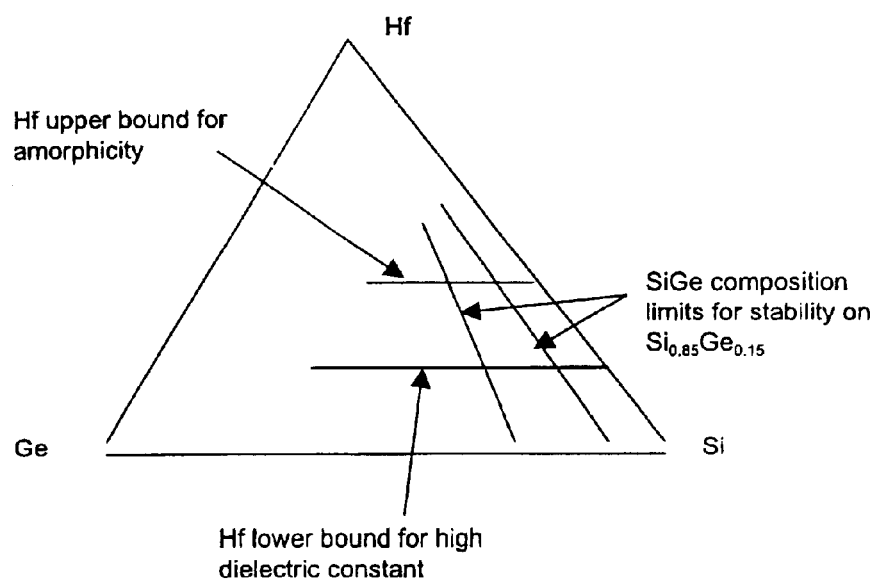
FIG. 2 is a composition diagram.

The trapezoidal region of FIG. 2 illustrates Hf—Ge—Si proportions based on the principles of (1) high enough dielectric constant by minimum metal content, (2) low enough leakage by amorphicity, and (3) interface stability during deposition by Si/Ge ratios.

As with the first preferred embodiments, the LPCVD precursors essentially react on the surface, and an overall reaction could approximate:

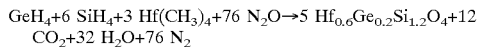
$GeH_4 + 6\ SiH_4 + 3\ Hf(CH_3)_4 + 76\ N_2O \rightarrow 5\ Hf_{0.6}Ge_{0.2}Si_{1.2}O_4 + 12\ CO_2 + 32\ H_2O + 76\ N_2$ The silicate-germanate has roughly the same Ge to Si ratio as the SiGe surface in the PMOS areas, and this composition deters interfacial layers forming. Indeed, with an overly oxidizing deposition the silicon may preferentially oxidize and leave Ge at the interface.

Other LPCVD precursors analogous to those of the first preferred embodiments could be used.

4. Silicate-germanate Gate Dielectric on Ge Preferred Embodiments

Third preferred embodiments follow the steps of the second preferred embodiments but apply to a Ge surface in both PMOS and NMOS areas. A silicate-germanate gate dielectric would be stable on Ge. If fact, the ratio of silicon to germanium in the gate dielectric is not constrained by underlying substrate silicon as in the second preferred embodiments. Thus sputter deposit $Hf_xGe_wSi_zO_4$ with x again constrained to a range such as [0.3, 0.8] to insure high enough dielectric constant without crystallization. Indeed, the third preferred embodiments provide dielectrics of compositions such as $Hf_{0.7}Ge_{1.3}O_4$ on Ge surfaces. Similarly, Zr substituted for Hf, or a mixture of both, provides alternative dielectrics.

5. Silicate-germanate Isolation Dielectric Preferred Embodiments

Other preferred embodiments follow the steps of the foregoing preferred embodiments but substitute a silicate-germanate dielectric for at least part of the trench isolation fill in step (1). This may be best if trenching is done in or through a SiGe of Ge layer so interfacial problems with Ge can be limited. Additionally, passivation with hydrogen applies to both Si and Ge.

6. Disposable Gate Preferred Embodiment

FIGS. 3a–3f are analogous to FIGS. 1a–1d and illustrate a disposable gate process which uses a dummy gate oxide. In particular, disposable gate preferred embodiment proceeds as follows.

(1) Substrate.

Figure 3A:
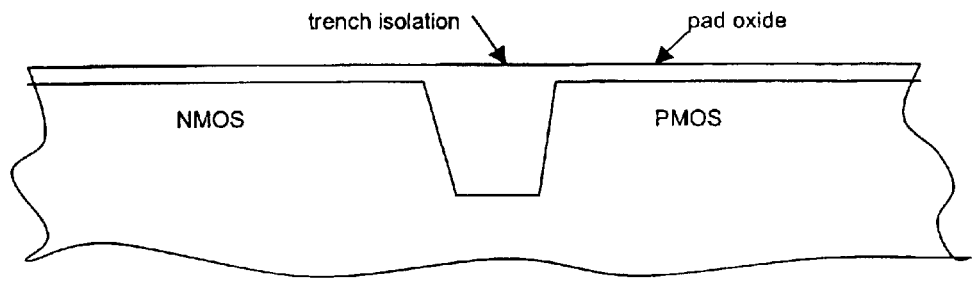
FIGS. 3a–3g are cross sectional elevation views of steps in a disposable gate preferred embodiment fabrication method.
Figure 3B:
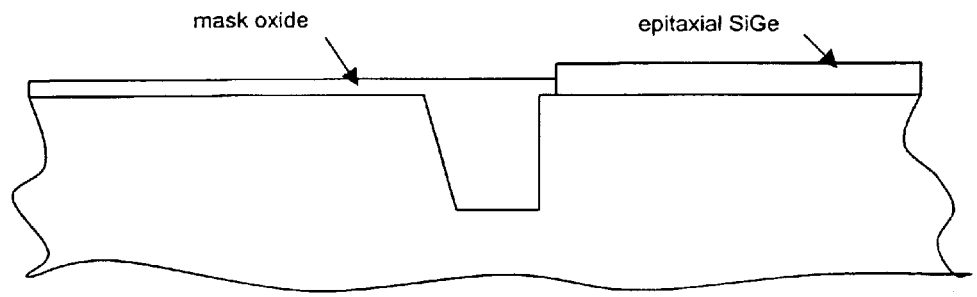

Start with the same trench isolation and SiGe epitaxy as in the first preferred embodiment; see FIGS. 3a–3b which are the same as FIGS. 1a–1b.

(2) Dummy Gate Dielectric

Figure 3C:
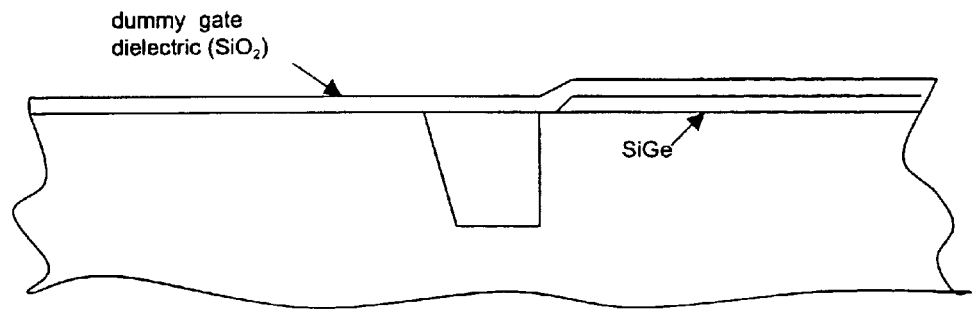
Figure 3D:
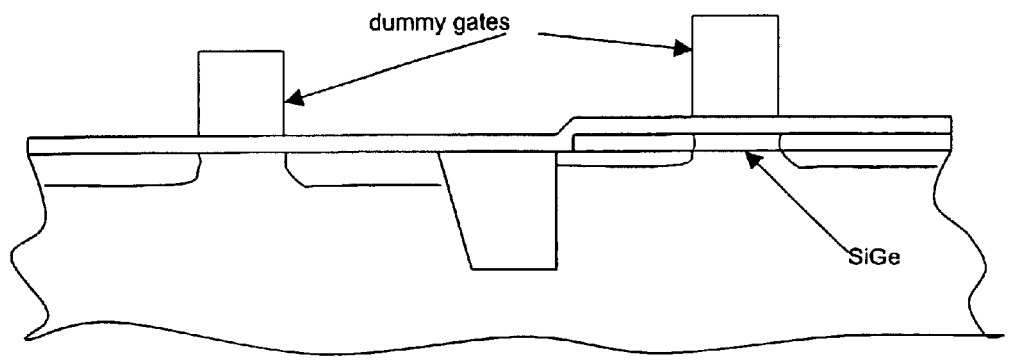
Figure 3E:
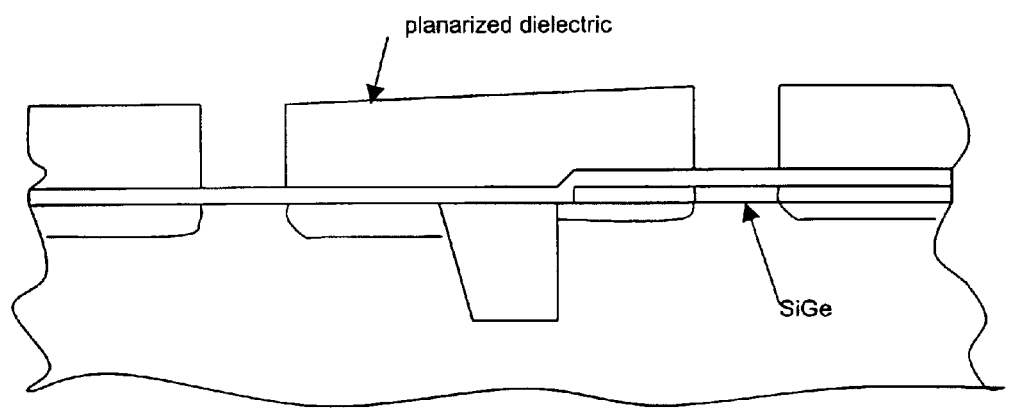
Figure 3F:
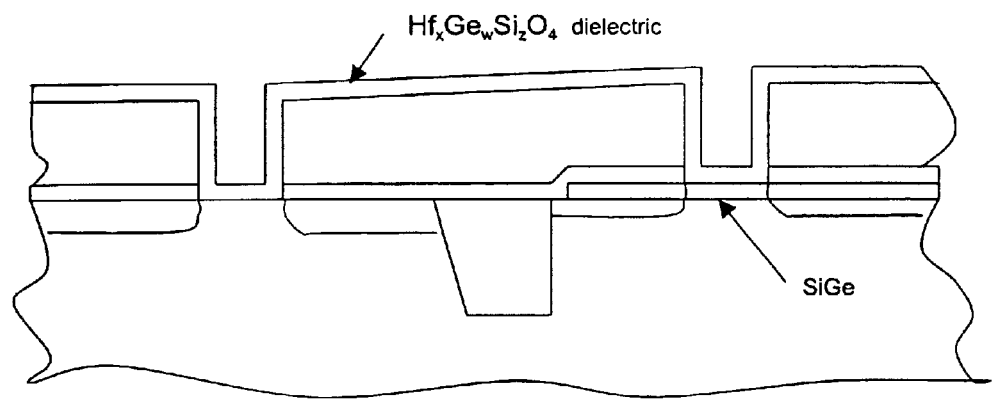

Deposit a thin (e.g., 30 nm) layer of silicon dioxide as a dummy gate dielectric; see FIG. 3c.

(3) Dummy Gate

Deposit polysilicon and pattern it to form dummy (disposable) gates. Then implant source/drains; see FIG. 3d.

(4) PMD

Deposit premetal level dielectric (PMD) and planarize. The PMD may be multilayer such as a first thin conformal silicon dioxide layer for diffusion purposes, followed by a fluorinated silicon dioxide (FSG) for lower dielectric constant, and lastly an upper doped silica layer (e.g., BPSG) for gettering purposes. After etchback or chemical mechanical polishing the PMD is thinned sufficiently to expose the polysilicon dummy gates. Then the dummy gates are selectively etched away; see FIG. 3e.

(5) Gate Dielectric.

Etch away the exposed dummy gate oxide at the bottoms of the openings left by the removal of the dummy gates. This etch may also remove some of the top of the PMD layer, but dummy gate oxide is only 30 nm thick, so the etch can be short. Then deposit $Hf_xGe_wSi_zO_4$ gate dielectric by sputtering or LPCVD to a thickness of 10 nm; see FIG. 3f.

(6) Gate Formation

Figure 3G:
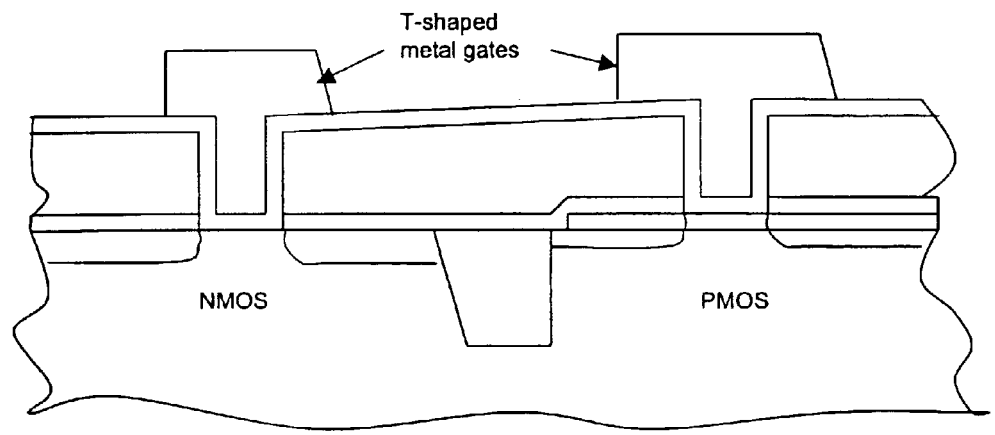

Deposit gate metal (e.g., TiN) to both fill the openings in the PMD (locations of the dummy gates) and cover the PMD to a thickness of 200 nm. Then pattern the metal to form T-shaped gates; see FIG. 3g.

The lower temperatures/thermal-budget associated with the replacement gate approach should result in an even greater preservation of amorphicity and stability. This should permit more metal-rich dielectric compositions and thereby higher dielectric constants. Indeed, the trapezoidal region in FIG. 4 illustrates a metal-rich proportion region for the dielectric: the upper Hf limit is roughly 0.8 to avoid $HfO_2$ crystallization and the lower limit is roughly 0.6 to avoid $HfSiO_4$ crystallization.

7. Modifications

The preferred embodiments may be modified in various ways while retaining one or more of the features of a silicate and/or silicate germanate gate dielectric on a Si and/or SiGe substrate.

Figure 4:
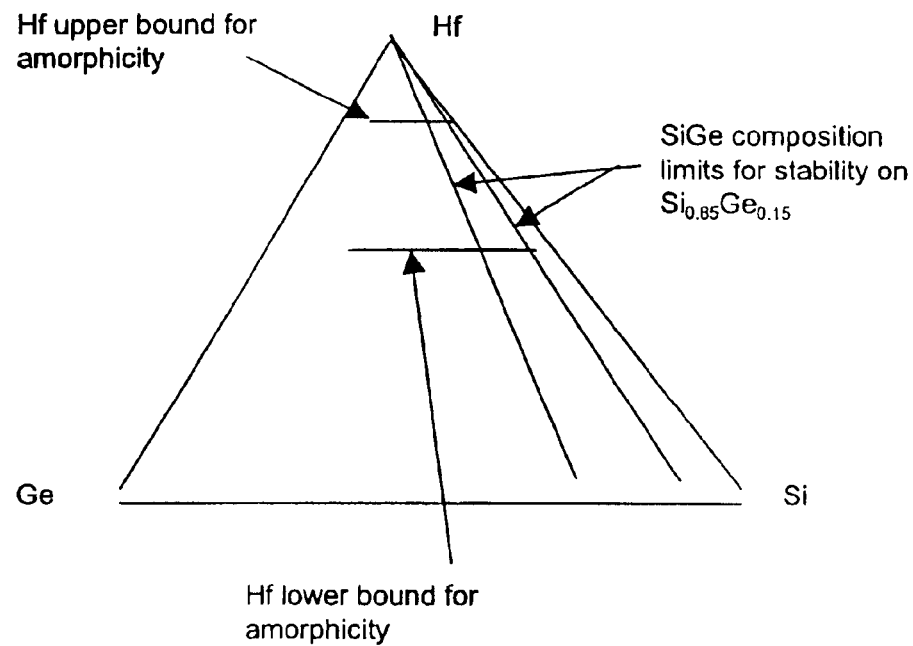
FIG. 4 is a composition diagram.

For example, Hf could be replaced with Zr (or a mixture of Hf and Zr to further enhance amorphicity); a differing SiGe composition, such as $Si_{0.7}Ge_{0.3}$, with the tie lines to Hf in FIGS. 2 and 4 pivoted towards the Ge corner; the dimensions, including layer thicknesses, could be varied; . . .

What is claimed is:

1. An integrated circuit, comprising:
   (a) MOS devices with metal silicate germanate gate dielectric where said metal is taken from the group consisting of Hf, Zr, and mixtures thereof; and
   (b) interconnections among said devices.

2. The integrated circuit of claim 1, wherein:
   (a) said MOS devices include PMOS devices with a Si—Ge channel region; and
   (b) said MOS devices include NMOS devices with a Si channel region.

3. The Integrated circuit of claim 1, wherein:
   (a) said gate dielectric has said metal equal Hf and the Hf—Ge—Si proportions as defined by the trapezoidal region of FIG. 2.

4. The integrated circuit of claim 1, wherein:
   (a) said gate dielectric has said metal equal Hf and the Hf—Ge—Si proportions as defined by the trapezoidal region of FIG. 4.

5. The integrated circuit of claim 1, further comprising:
   (a) bipolar devices with Si emitter material together with Si—Ge base material.

* * * * *